United States Patent
Nakagawa

(10) Patent No.: US 6,555,922 B1
(45) Date of Patent: Apr. 29, 2003

(54) IC BONDING PAD COMBINED WITH MARK OR MONITOR

(75) Inventor: Kenji Nakagawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/427,925

(22) Filed: Oct. 27, 1999

(30) Foreign Application Priority Data

Mar. 18, 1999 (JP) ............................................ 11-074483

(51) Int. Cl.[7] .......................... H01L 23/48; H01L 29/40
(52) U.S. Cl. ...................... 257/786; 257/797; 257/208; 257/211; 257/207; 257/734; 257/776
(58) Field of Search .................. 252/734, 784, 252/786, 797, 208, 207, 211, 710, 758, 701, 776

(56) References Cited

U.S. PATENT DOCUMENTS

| | | | | |
|---|---|---|---|---|
| 4,381,201 A | * | 4/1983 | Sakurai ........................ 29/571 |
| 5,060,045 A | * | 10/1991 | Owada et al. | |
| 5,220,199 A | * | 6/1993 | Owada et al. ............... 257/737 |
| 5,365,112 A | * | 11/1994 | Ohshima ...................... 257/784 |
| 5,394,013 A | * | 2/1995 | Oku et al. ................... 257/786 |
| 5,404,047 A | * | 4/1995 | Rostoker et al. ............. 257/786 |
| 5,414,297 A | * | 5/1995 | Morit et al. ................. 257/620 |
| 5,742,468 A | * | 4/1998 | Matsumoto et al. ......... 361/229 |
| 5,751,065 A | * | 5/1998 | Chittipeddi et al. ......... 257/758 |
| 5,847,466 A | * | 12/1998 | Ito .............................. 257/758 |
| 5,936,289 A | * | 8/1999 | Mori ........................... 257/786 |
| 5,945,716 A | * | 8/1999 | Iwasaki et al. .............. 257/383 |
| 6,232,662 B1 | * | 5/2001 | Saran .......................... 257/734 |
| 6,261,883 B1 | * | 7/2001 | Koubuchi et al. ........... 257/776 |

FOREIGN PATENT DOCUMENTS

| | | | |
|---|---|---|---|
| JP | 60-211941 | | 10/1985 |
| JP | 61-174659 | * | 8/1986 |
| JP | 8-111419 | | 4/1996 |
| JP | 9-321104 | | 12/1997 |

* cited by examiner

Primary Examiner—Alexander O. Williams
(74) Attorney, Agent, or Firm—Armstrong Westerman & Hattori, LLP

(57) ABSTRACT

A semiconductor device includes a bonding pad formed on a substrate and a mark region formed on the substrate right underneath the bonding pad, such that the mark region is covered by the bonding pad.

13 Claims, 11 Drawing Sheets

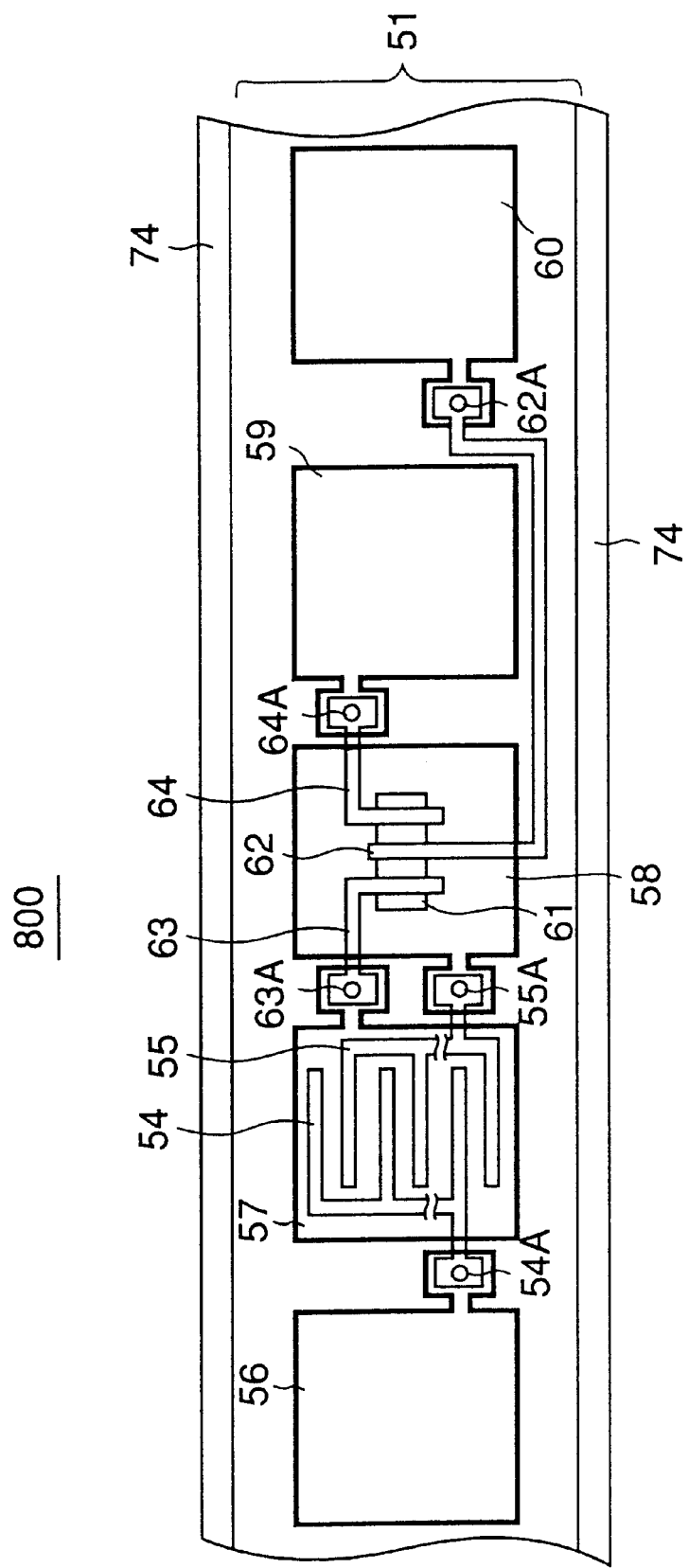

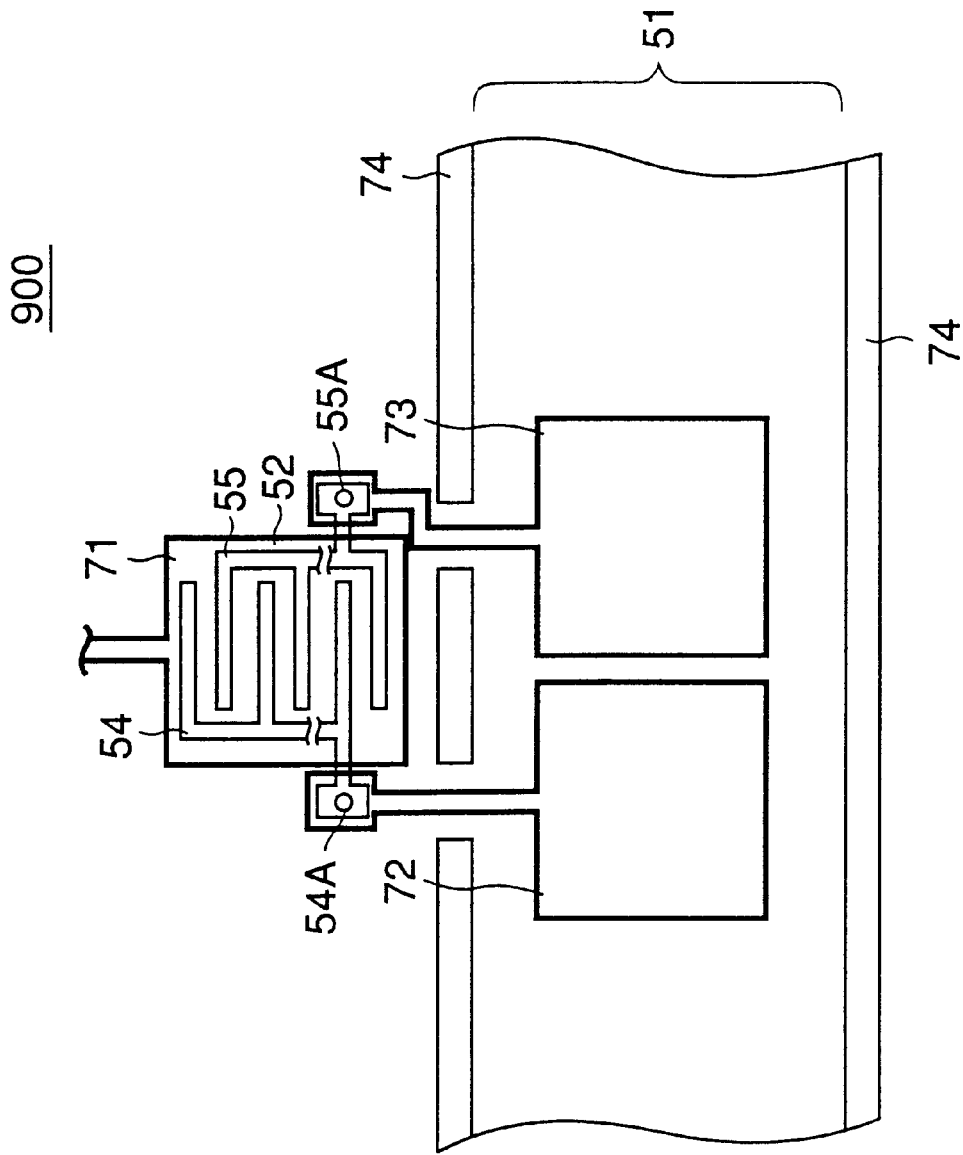

IC BONDING PAD COMBINED WITH MARK OR MONITOR

TITLE OF THE INVENTION
SEMICONDUCTOR DEVICE HAVING A BONDING PAD

BACKGROUND OF THE INVENTION

The present invention generally relates to semiconductor devices and more particularly to a semiconductor device having a mark pattern or a monitor pattern for process control.

In a semiconductor integrated circuit in which a number of active devices such as MOS transistors are integrated on a common semiconductor substrate, it is generally practiced to provide various mark patterns and monitor patterns on the semiconductor substrate for the purpose of process control such as positional alignment or detection of alignment error.

As these mark patterns and monitor patterns are used only during the fabrication process of the semiconductor integrated circuit, the mark patterns and the monitor patterns have conventionally been formed on the dicing lines of the semiconductor substrate, so that the area of the semiconductor substrate is not unnecessarily occupied by the mark patterns and monitor patterns. The patterns thus formed on the dicing lines are removed at the time of dicing of the semiconductor substrate into individual semiconductor chips.

On the other hand, the demand for the positional alignment is becoming more and more rigorous in the fabrication process of recent ultra-fine semiconductor devices called "submicron devices," "sub-half-micron devices" or "sub-quarter-micron devices." Further, the fabrication process of such recent ultra-fine semiconductor devices requires control of increased number of process parameters, such as pattern size control, etching process control, chemical mechanical polishing (CMP) process control, film quality monitoring, short-circuit detection, contact resistance monitoring, transistor operation monitoring, LSI operation monitoring, and the like.

With such an increase in the number of the process parameters to be controlled, it should be noted that there also occurs an increase in the number of the mark patterns and the monitor patterns which are provided on the semiconductor substrate for the purpose of controlling the process parameters.

As a result of the foregoing increase in the number of the mark patterns and monitor patterns on a semiconductor substrate, there can be a case in which the area of the dicing line, on which a mark pattern or a monitor pattern is to be formed, is already occupied by mark patterns or monitor patterns, and that there is no suitable space available in the vicinity of the existing mark pattern or monitor pattern.

While it is certainly possible to provide some of the mark patterns and monitor patterns inside the area of a semiconductor integrated circuit, such mark patterns and monitor patterns formed inside the semiconductor integrated circuit cause a decrease in the available area of the semiconductor substrate for the formation of various active devices or interconnection patterns of the semiconductor integrated circuit.

Further, such conventional semiconductor integrated circuits have a drawback, due to the fact that the dicing lines generally have a depressed surface on the semiconductor substrate, in that the result of the monitoring process of a parameter, such as the measurement of the thickness of a film, may be different from the result of the monitoring process of the same parameter conducted outside.the dicing line. When such a discrepancy exists between the result of the monitoring process conducted by a monitoring pattern and the actual process, the process control of the semiconductor fabrication process becomes unreliable.

SUMMARY OF THE INVENTION

Accordingly, it is a general object of the present invention to provide a novel and useful semiconductor device wherein the foregoing problems are eliminated.

Another and more specific object of the present invention is to provide a semiconductor device including a large number of process control patterns for facilitating the fabrication of the semiconductor device with an improved yield.

Another object of the present invention is to provide a semiconductor device, comprising:

a substrate;

an active device formed on said substrate;

a bonding pad formed on said substrate; and a mark region formed on said substrate right underneath said bonding pad, such that said mark region is covered by said bonding pad.

Another object of the present invention is to provide a semiconductor device, comprising:

a substrate;

an active device formed on said substrate;

a bonding pad formed on said substrate; and a monitoring region formed on said substrate under said bonding pad, such that said monitoring region is covered by said bonding pad.

According to the present invention, the problem of the mark region or monitoring region occupying the area of the semiconductor device unnecessarily, is successfully avoided. As a result of the present invention, the number of the mark patterns and the monitoring patterns on the substrate can be increased, and the fabrication process of the semiconductor device is controlled more closely. As the bonding region is formed inside a chip region, which is defined on the substrate by a dicing line, the monitoring of the fabrication process by using such a monitoring region provides information on the state of the process more accurately than in the conventional case of using the monitoring patterns that are formed in the dicing line.

Other objects and further features of the present invention will become apparent from the following detailed description when read in conjunction with the attached drawings.

BRIEF DESCRIPTION OF THE DRAWINGS

FIG. 9 is a diagram showing the construction of a semiconductor device according to an eighth embodiment of the present invention;

FIG. 10 is a diagram showing the construction of a semiconductor device according to a ninth embodiment of the present invention;

DETAILED DESCRIPTION OF THE PREFERRED EMBODIMENT [PRINCIPLE]

Figure 1A:
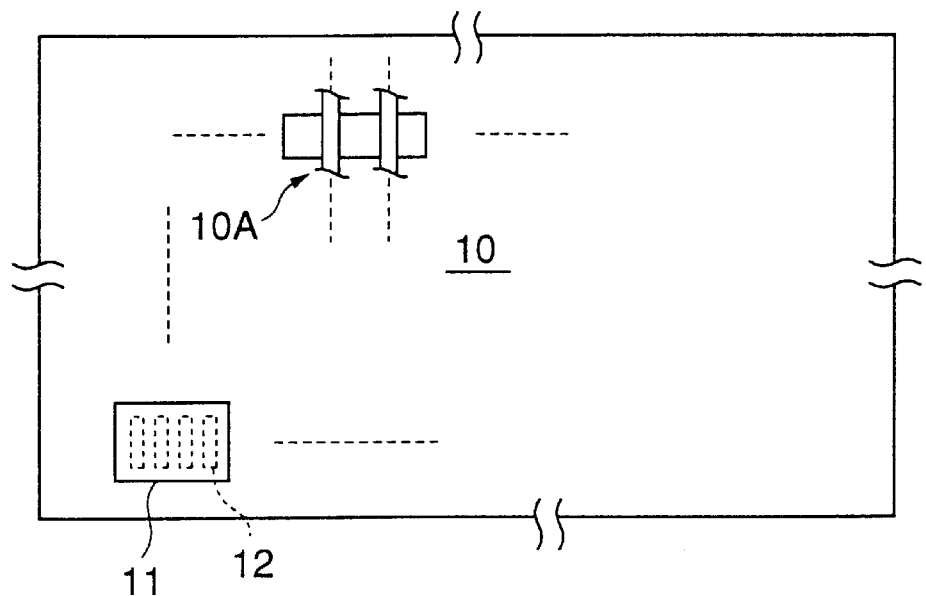
FIGS. 1A and 1B are diagrams showing the principle of the present invention.
Figure 1B:
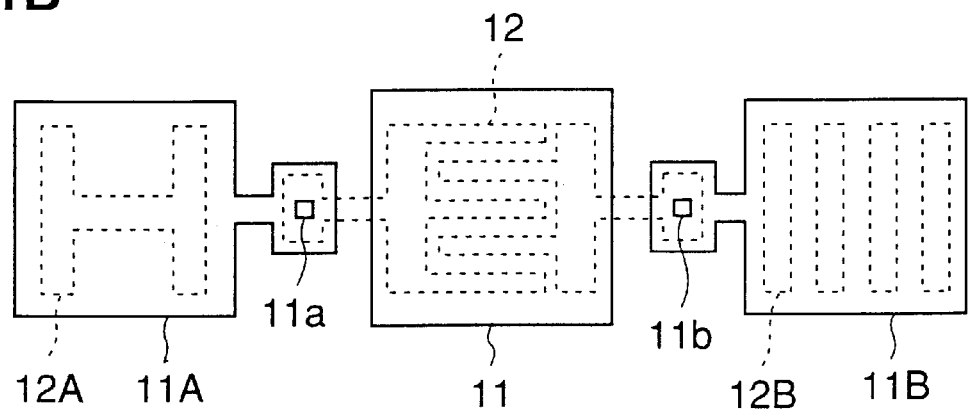

FIGS. 1A and 1B explain the principle of the present invention.

Referring to FIG. 1A, a semiconductor device includes a number of active devices 10A formed on a semiconductor substrate 10, wherein the semiconductor substrate 10 further carries thereon a number of bonding pads 11.

In the present invention, it should be noted that the various control patterns 12 are formed under the bonding pads 11, wherein the control patterns 12 may include an alignment mark pattern used for various alignment processes or a monitoring pattern used for monitoring various processes. The control patterns 12 may, depending on the purpose thereof, be an insulation pattern or a metal pattern. Further, there may be a case in which the control pattern 12 is provided by a continuous insulation film. By using these control patterns 12, it is possible to control the fabrication process of the semiconductor device for maximum yield and maximum efficiency of production.

By forming the control patterns 12 right underneath the bonding pads 11 as represented in FIG. 1A, the patterns 12 do not occupy any extra area on the substrate 10, and thus, there occurs no decrease of the chip region, on which the active device elements are to be formed.

Thus, the present invention is useful for forming the control patterns 12 inside the chip region in such a case in which the dicing line region cannot accommodate all of the control patterns 12. As the surface of the chip region on which the patterns 12 are formed is identical with the surface on which the active devices are formed, the control of the fabrication process by using such control patterns 12 in the chip region provides an improved control of the fabrication process as compared with the case of using the control patterns 12 that are formed on the depressed dicing lines.

FIG. 1B shows an example of the control pattern 12 that include a pair of connection pads for external interconnection. The control pattern 12 FIG. 1B may be the one used for short-circuit detection.

Referring to FIG. 1B, there are formed bonding pads 11A and 11B on the semiconductor substrate 10 adjacent to the foregoing bonding pad 11, and the bonding pads 11A and 11B are electrically connected to the foregoing connection pads at respective contact holes 11a and 11b.

In such a construction, too, it is possible to dispose other control patterns 12A and 12B underneath the foregoing bonding pads 11A and 11B. It should be noted that the control pattern 12A is not connected to the bonding pad 11A thereon electrically. Similarly, the control pattern 12B is not connected to the bonding pad 11B thereon electrically.

It is of course possible to provide the construction of FIG. 1B on the dicing line.

Thus, the present invention provides an effective utilization of the substrate surface area for forming various control patterns. As a result of the present invention, therefore, the number of the control patterns on the semiconductor substrate is increased without decreasing the area for the active device elements. The present invention is particularly useful in the fabrication of ultra-fine semiconductor integrated circuits in which process control is necessary for a very large number of process parameters.

FIRST EMBODIMENT

Figure 2A:
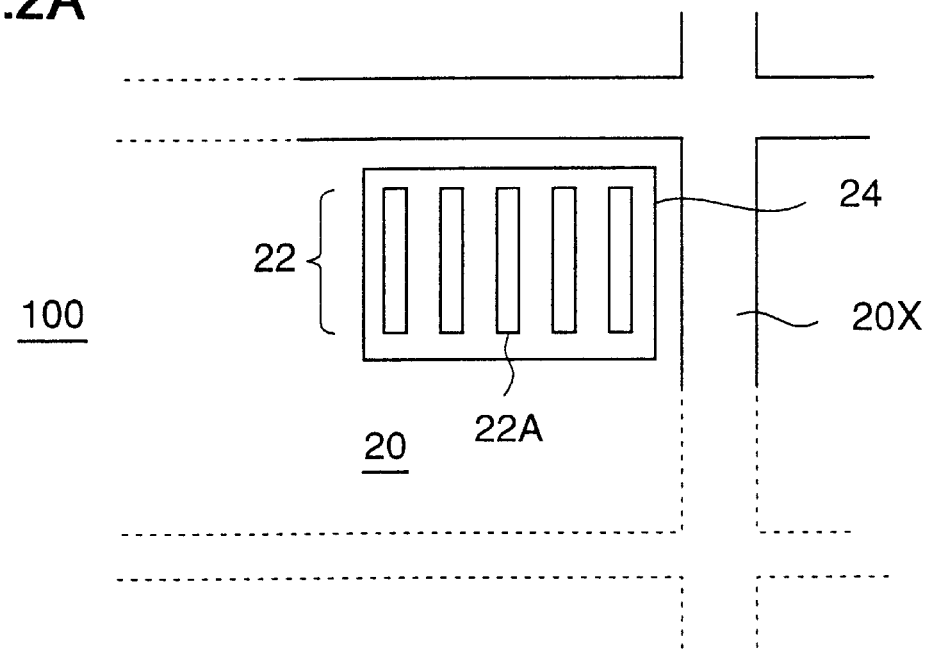
FIGS. 2A and 2B are diagrams showing the construction of a semiconductor device according to a first embodiment of the present invention respectively in a plan view and in a cross-sectional view.
Figure 2B:
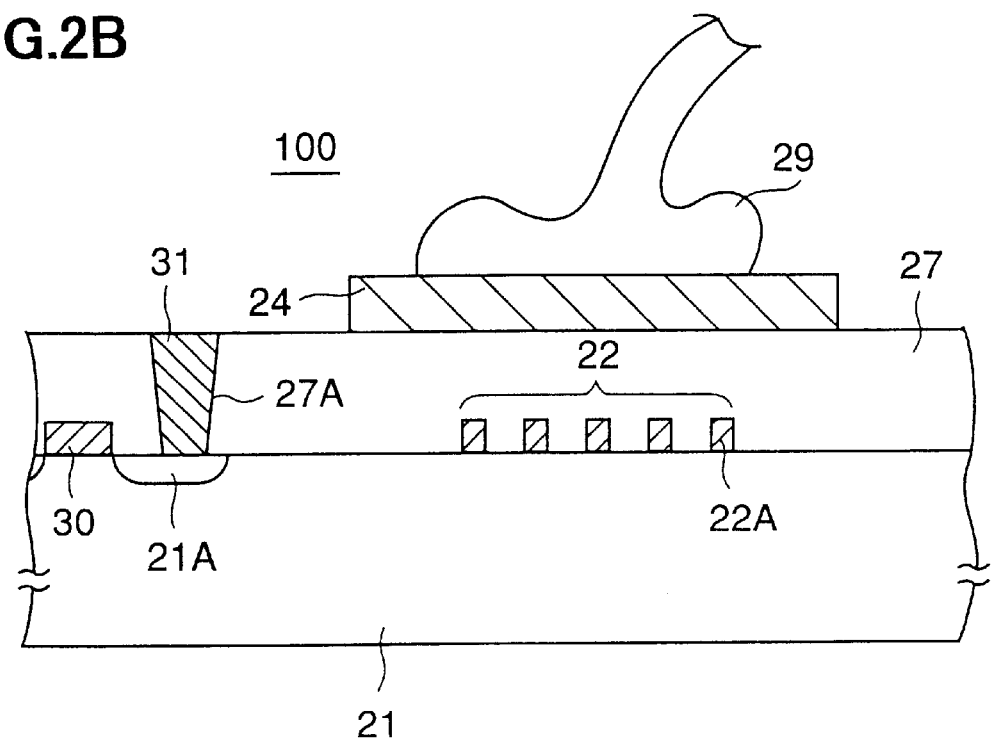

FIGS. 2A and 2B show the construction of a semiconductor device 100 respectively in a plan view and in a cross-sectional view, wherein the semiconductor device 100 includes an alignment mark 22.

Referring to FIG. 2A, the alignment mark 22 is formed of a repetition of a conductor pattern 22A and is provided on a chip region 20, which is defined on a Si substrate 21 (see FIG. 2B) by a dicing line 20X. In the illustrated example, the alignment mark 22 forms a diffraction grating and may be used for the positioning control of a stepper during the patterning process of a conductor layer, insulation layer or a semiconductor layer formed on the Si substrate 21.

Referring to the cross-sectional view of FIG. 2B, it will be noted that the Si substrate 21 carries thereon agate electrode 30, and a diffusion region 21A is formed in the Si substrate 21 adjacent to the gate electrode 30. Further, an interlayer insulation film 27TO BE TO is provided on the Si substrate 21so as to cover the gate electrode 30, and a contact hole 27A is formed in the interlayer insulation film 37 so as to expose the diffusion region 21A. The contact hole 27A is filled by a conductor plug 31. In the construction of FIG. 2B, the alignment mark 22 is formed on the Si substrate 21 simultaneously with the step of forming the gate electrode 30, by using a material identical with the material used for the gate electrode 30. Further, a bonding pad 24 is formed on the interlayer insulation film 27 so as to cover the alignment mark 22, and a bonding wire is connected to the bonding pad 24 thus formed. It should be noted that the bonding pad 24 is formed after the substrate 21 is positioned properly in the stepper by using the alignment mark 22 and the patterning of the contact hole 27A is achieved.

In the construction of FIG. 2B, the alignment mark 22 is formed on the Si substrate 21 simultaneously with the step of forming the gate electrode 30, by using a material identical with the material used for the gate electrode 30. Further, a bonding pad 24 is formed on the interlayer insulation film 27 so as to cover the alignment mark 22, and a bonding wire is connected to the bonding pad 24 thus formed. It should be noted that the bonding pad 24 is formed after the substrate 21 is positioned properly in the stepper by using the alignment mark 22 and the patterning of the contact hole 27A is achieved.

In the construction of FIGS. 2A and 2B, it should be noted that the alignment mark 22 is formed right underneath the bonding pad 24. Thus, there occurs no such a problem that the alignment mark 22 occupies the chip region unnecessarily. The alignment mark 22 and the bonding pad 24 are separated from each other by the interlayer insulation film 27, and there is no electrical connection formed between the alignment mark 22 and the bonding pad 24.

SECOND EMBODIMENT

Figure 3A:
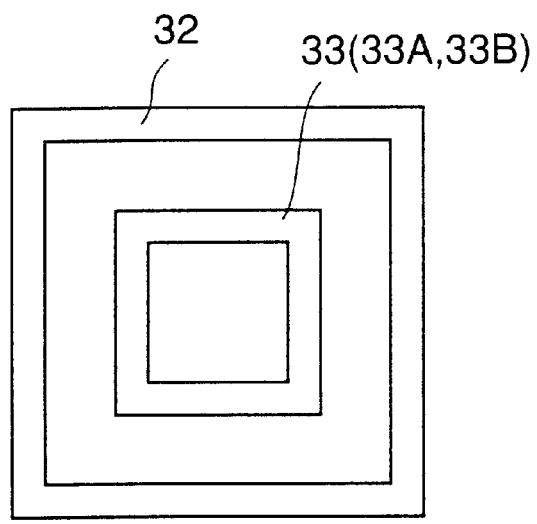
FIGS. 3A and 3B are diagrams showing the construction of a semiconductor device according to a second embodiment of the present invention respectively in a plan view and in a cross-sectional view.
Figure 3B:
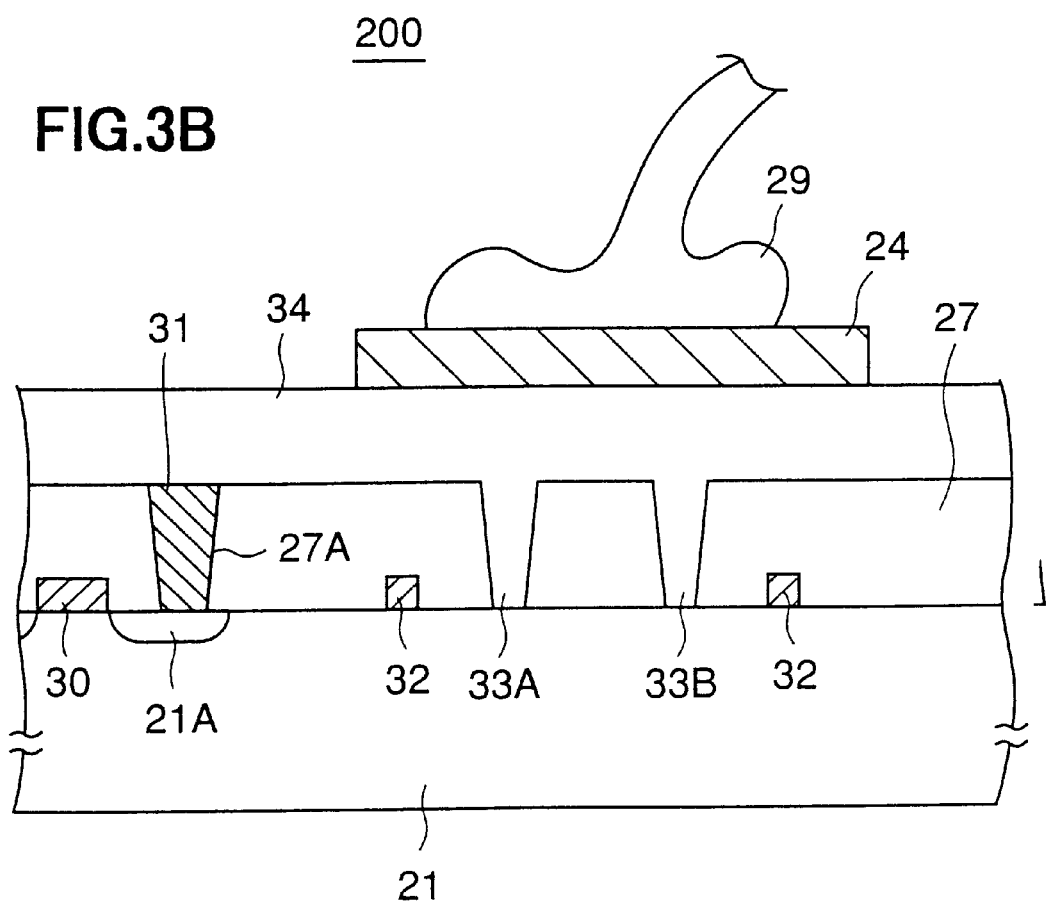

FIGS. 3A and 3B show the construction of a semiconductor device 200 according to a second embodiment of the present invention respectively in a plan view and in a cross-sectional view, wherein those parts corresponding to the parts described previously are designated by the same reference numerals and the description thereof will be omitted.

Referring to FIGS. 3A and 3B, the semiconductor device includes, on the Si substrate 21, a primary mark pattern 32 which is formed simultaneously to the gate electrode 30. The primary mark pattern 32 is then covered by the interlayer insulation film 27 similarly to the gate electrode 30, wherein the interlayer insulation film 27 is formed with openings 33A and 33B that form together a single groove 33. See the plan view of FIG. 3A. The groove 33 thus formed acts as a secondary mark pattern. The openings 33A and 33B of the groove 33 are formed so as to expose the surface of the substrate 21. In the illustrated example, the primary mark pattern 32 is formed so as to surround the secondary mark pattern 33.

By detecting the positional relationship of the secondary mark pattern 33 with respect to the primary mark pattern 32, it becomes possible to detect the positional error of the contact hole 27A with respect to the gate electrode 30.

When the specimen is confirmed to be good with regard to the positional error, a deposition of a planarizing interlayer insulation film 34 is made such the planarizing interlayer insulation film 34 fills the foregoing groove 33. The planarizing interlayer insulation film 34 may be formed of an SOG or a low-melting glass. After the interlayer insulation film 34 is thus formed, the bonding pad 24 is formed on the interlayer insulation film 34 so as to cover the primary and secondary mark patterns 32 and 33. Further, the bonding wire 29 is connected to the bonding pad 24.

In the present embodiment, too, the primary and secondary mark patterns 32 and 33 are formed right underneath the bonding pad 24, and the problem of the decrease of the chip region of the Si substrate 1 for formation of the active devices is minimized.

THIRD EMBODIMENT

Figure 4:
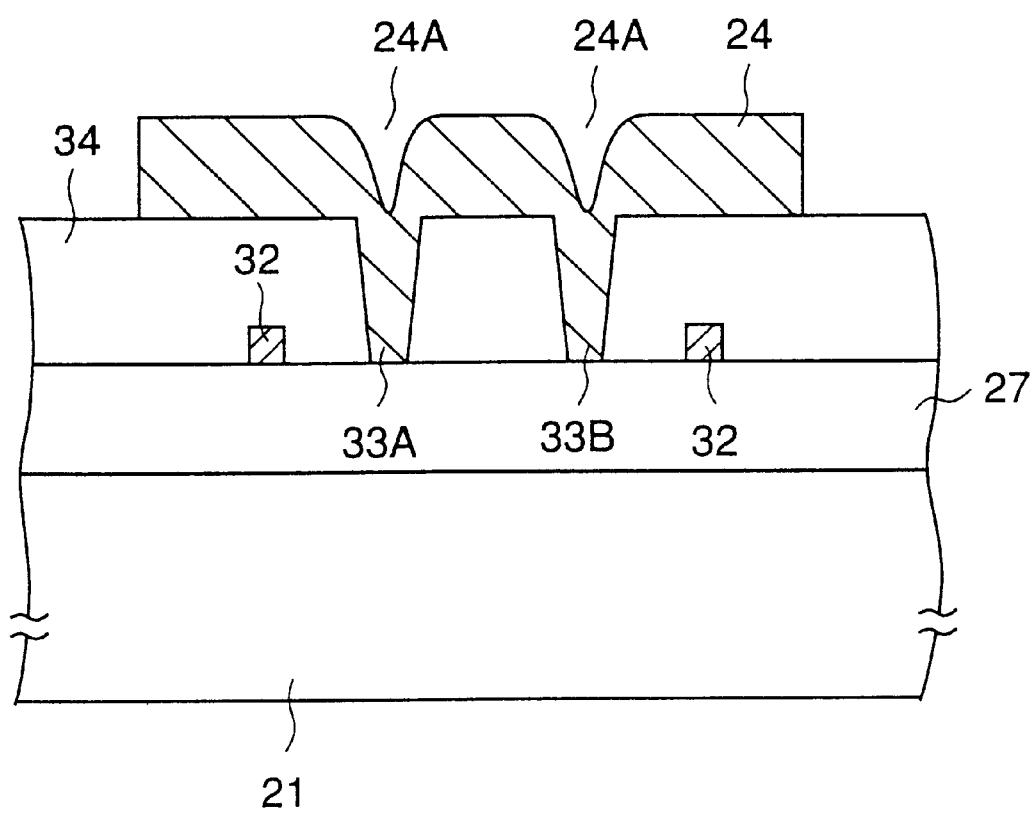
FIG. 4 is a diagram showing the construction of a semiconductor device according to a third embodiment of the present invention.

FIG. 4 shows the construction of a semiconductor device 300 according to a third embodiment of the present invention, wherein those parts corresponding to the parts described previously are designated by the same reference numerals and the description thereof will be omitted.

Referring to FIG. 4, the semiconductor device 300 is a modification of the semiconductor device 200 of the previous embodiment and includes the primary mark pattern 32 that is now formed on the interlayer insulation film 27 on the Si substrate 21. The primary mark patterns 32 may be formed simultaneously with other conductor pattern (not illustrated) formed on the interlayer insulation film 27. In the case of the semiconductor device 300, it should be noted that the primary mark pattern 32 is covered by the interlayer insulation film 34, and the secondary mark pattern 33, represented in the form of the openings 33A and 33B, is formed in the interlayer insulation film 34 simultaneously with other contact holes formed therein.

In the construction of FIG. 4, it should be noted that the openings 33A and 33B do not expose the Si substrate 21.

Thus, it is possible to form the bonding pad 24 directly on the interlayer insulation film 34, after the positional error detection conducted by using the primary mark 32 and the secondary mark 33, such that the bonding pad 24 fills the openings 33A and 33B. In correspondence to the openings 33A and 33B, there appears a depression 24A on the top surface of the bonding pad 24.

In the present embodiment, too, the bonding pad 24 do not make an electrical contact with any of the primary and secondary mark patterns 32 and 33. As the primary and secondary mark patterns 32 and 33 are formed right underneath the bonding pad 24, there occurs no problem of the chip region being decreased as a result of the formation of the mark patterns 32 and 33.

FOURTH EMBODIMENT

Figure 5A:
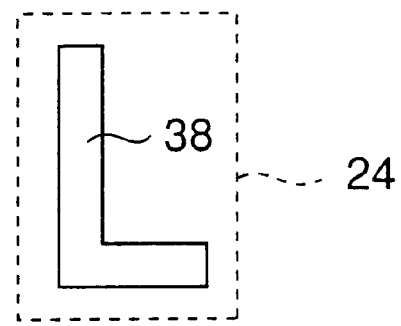
FIGS. 5A and 5B are diagrams showing the construction of a semiconductor device according to a fourth embodiment of the present invention respectively in a plan view and in a cross-sectional view.
Figure 5B:
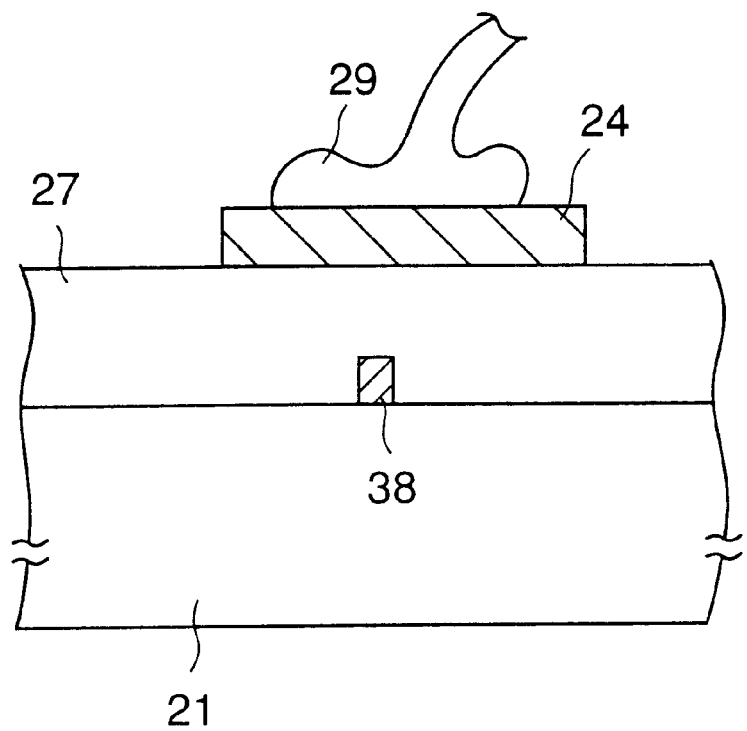

FIGS. 5A and 5B show the construction of a semiconductor device 400 having a gate size monitor pattern 38 respectively in a plan view and in a cross-sectional view, wherein those parts corresponding to the parts described previously are designated by the same reference numerals and the description thereof will be omitted.

Referring to FIGS. 5A and 5B, the monitor pattern 38 has an L-shaped form and is formed on the Si substrate 21 simultaneously with other gate electrode patterns (not shown) corresponding to the gate electrode 30.

The monitor pattern 38 is covered by the foregoing interlayer insulation film 27 and the bonding pad 24 is formed on the interlayer insulation film 27 such that the bonding pad 24 covers the monitor pattern 38. As represented in the plan view of FIG. 5A, the bonding pad 24 has a size similar to that of the monitor pattern 38.

In the present embodiment, too, the monitor pattern 38 is electrically insulated from the bonding pad 24. As the monitor pattern 38 is formed right underneath the bonding pad 24, the formation of the monitor pattern 38 on the substrate 21 does not cause the problem of decrease of the chip region for the active device elements.

FIFTH EMBODIMENT

Figure 6A:
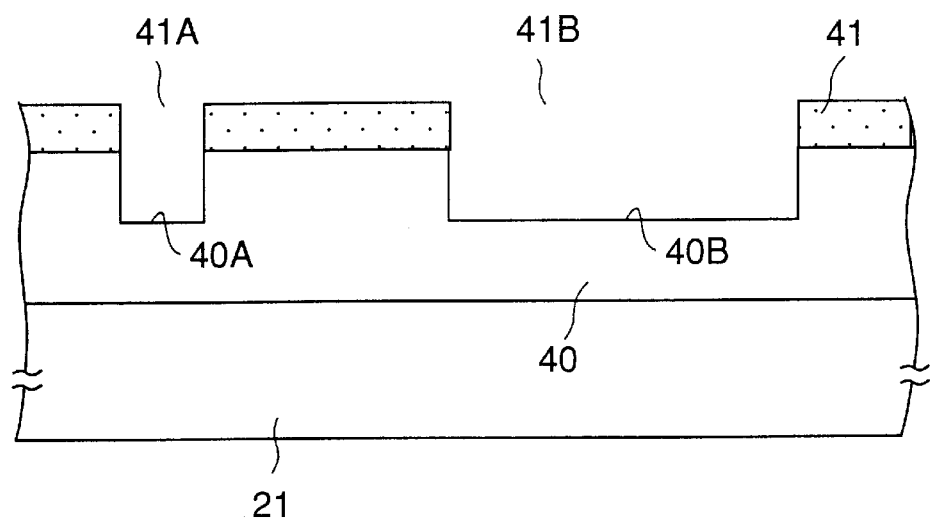
FIGS. 6A and 6B are diagrams showing the fabrication process of a semiconductor device according to a fifth embodiment of the present invention.
Figure 6B:
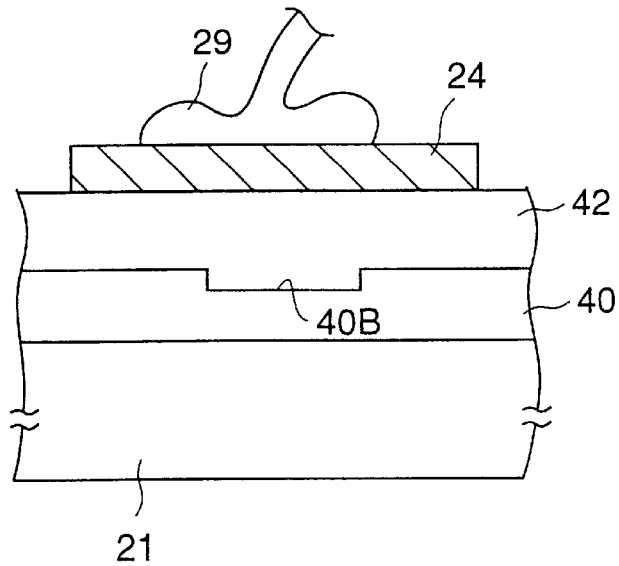

FIGS. 6A and 6B are diagrams showing the fabrication process of a semiconductor device 500 having an etching-control monitor pattern according to a fifth embodiment of the present invention, wherein those parts described previously are designated by the same reference numerals and the description thereof will be omitted.

Referring to FIG. 6A, the Si substrate 21 is covered by an insulation film 40, and a resist pattern 41 is formed on the insulation film 40 in the state that the resist pattern 41 includes openings 41A and 41B. It should be noted that the opening 41A is formed in correspondence to the depression to be formed in the insulation film 40, while the opening 41B is formed for the purpose of monitoring the progress of the etching process used for forming the foregoing depression. By applying an etching process to the insulation film 40 while using the resist pattern 41 as a mask, there is formed a desired depression 40A in the insulation film 40, simultaneously with a depression 40B, which constitutes a monitor pattern.

In the present embodiment, the resist pattern 41 is removed after the step of FIG. 6A and the depression 40B is irradiated by an optical beam. As the intensity of the optical beam thus reflected by the depression 40B changes depending on the depth of the depression 40B and thus depending on the thickness of the remaining insulation film 40, it is possible to evaluate the depth of the depression 40B, and hence the depth of the depression 40A, by measuring the intensity of such a reflected optical beam.

When the depth of the depression 40B has reached a predetermined, desired depth, the depression 40B is covered by an interlayer insulation film 42 deposited on the insulation film 40 as represented in FIG. 6B. Further, the bonding pad 24 is formed on the interlayer insulation film 42 so as to cover the depression 40B.

In the present embodiment, it should be noted that the monitor pattern is not a conductor pattern contrary to the case of the previous embodiments but a depression formed in an insulation film. Even in such a case, the monitor pattern does not occupy the chip region of the semiconductor substrate unnecessarily. In the present embodiment, too, the monitor pattern is not connected to the bonding pad electrically.

SIXTH EMBODIMENT

Figure 7A:
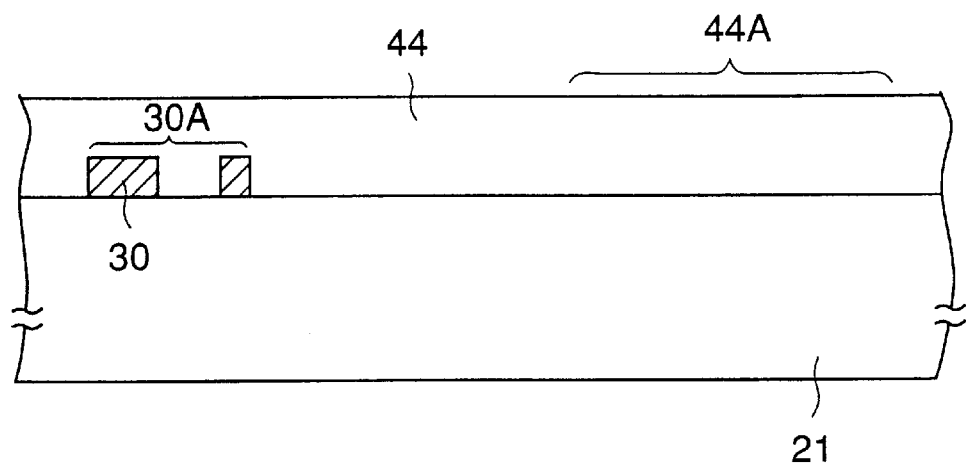
FIGS. 7A and 7B are diagrams showing the fabrication process of a semiconductor device according to a sixth embodiment of the present invention.
Figure 7B:
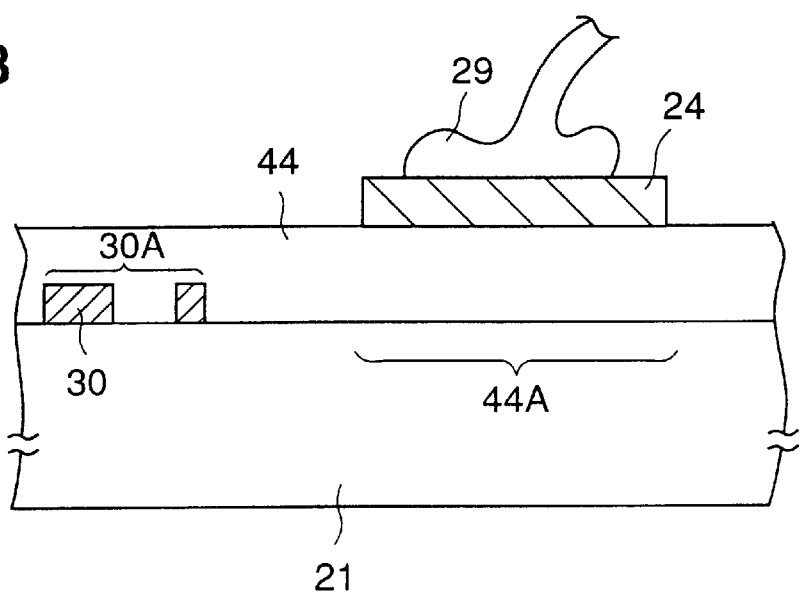

FIGS. 7A and 7B show the fabrication process of a semiconductor device 600 according to a sixth embodiment of the present invention, wherein those parts corresponding to the parts described previously are designated by the same reference numerals and the description thereof will be omitted.

Referring to FIG. 7A, there is formed a conductor pattern 30 on the surface of the Si substrate 21, wherein the conductor pattern 30A includes the foregoing gate electrode 30. The conductor pattern 30A is covered by an interlayer insulation film 44 formed on the substrate 21.

In the present embodiment, the interlayer insulation film 44 is subjected to a chemical mechanical polishing process for planarization, wherein the thickness of the interlayer insulation film 44 is monitored by irradiating an optical beam to the interlayer insulation film 44 at the region not covered by the conductor pattern 30A.

When the thickness of the interlayer insulation film 44 has reached a predetermined value, there is formed a bonding pad 24 on the interlayer insulation film 44 so as to cover a region 44A thereof.

Thus, in the present embodiment, the region 44A of the interlayer insulation film 44 itself is used for the monitoring pattern of the interlayer insulation film 44.

SEVENTH EMBODIMENT

Figure 8A:
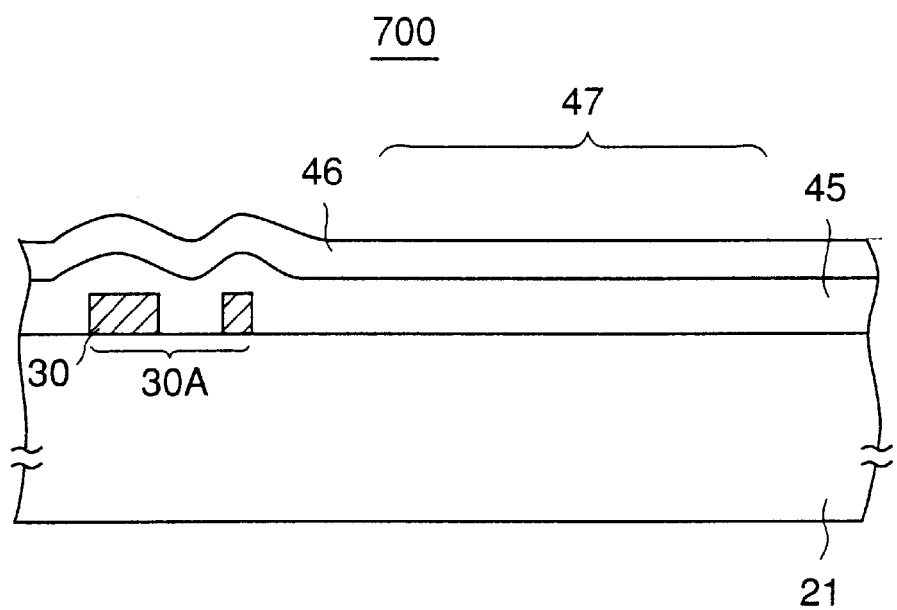
FIGS. 8A and 8B are diagrams showing the fabrication process of a semiconductor device according to a seventh embodiment of the present invention.
Figure 8B:
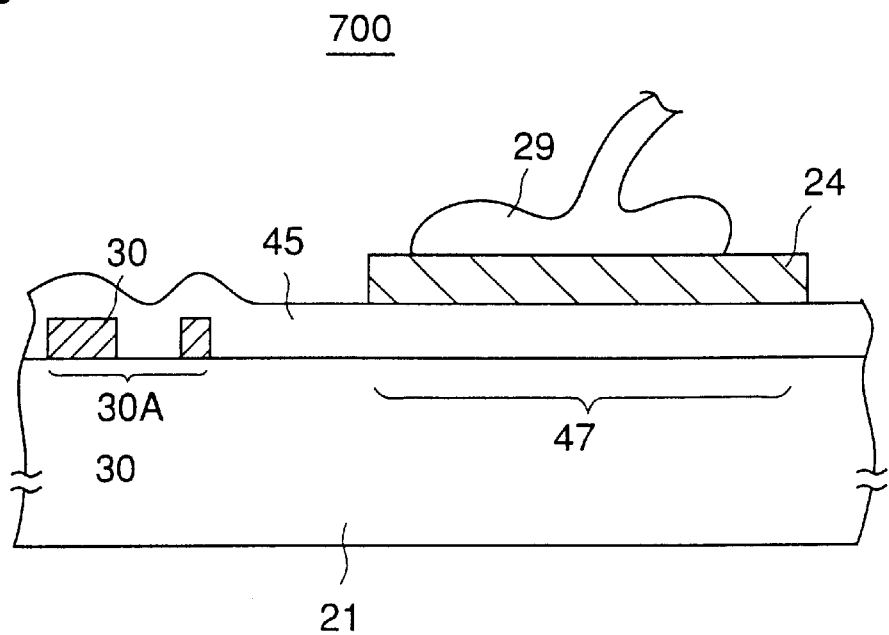

FIGS. 8A and 8B show the fabrication process of a semiconductor device 700 according to a seventh embodiment of the present invention, wherein those parts corresponding to the parts described previously are designated by the same reference numerals and the description thereof will be omitted.

Referring to FIG. 8A, the Si substrate 21 is covered by a film 45 of $SiO_2$, and the like, wherein the film 45 is provided so as to cover the conductor pattern 30A that includes the gate electrode 30. Further, a film 46, of which quality is to be measured, is formed on the film 45. In the step of FIG. 8A, the quality of the film 46 is evaluated by measuring a complex refractive index or reflectance in a flat region 47 thereof.

Next, in the step of FIG. 8B, the film 46 is removed and the bonding pad 24 is formed on the foregoing flat region 47. Further, the bonding wire 29 is connected to the bonding pad 24 by a wire bonding process.

EIGHTH EMBODIMENT

FIG. 9 shows the construction of a semiconductor device 800 according to an eighth embodiment of the present invention.

Referring to FIG. 9, showing a dicing line 51 formed on a semiconductor substrate, the dicing line 51 is laterally bounded by moisture-proof guard rings 74 and carries thereon a short-circuit detection circuit which includes interdigital electrodes 54 and 55. The short-circuit detection circuit is further covered by an insulation film not illustrated.

It should be noted that the interdigital electrode 54 is connected to a pad electrode 56 formed on the insulation film via a contact hole 54A formed in the insulation film, while the interdigital electrode 55 is connected to another pad electrode 58 on the insulation film via a contact hole 55A formed in the insulation film.

Right underneath the pad electrode 58, there is formed a monitoring transistor having an active region 61, wherein it can be seen that the monitoring transistor further includes: a gate electrode crossing the active region 61; a first lead electrode 63 making a contact with a diffusion region formed in the active region 61 at a left-side of the gate electrode; and a second lead electrode 64 making a contact with a diffusion region formed in the active region 61 at a right-side of the gate electrode. It should be noted that the first lead electrode 63 is connected electrically to a pad electrode 57 formed on the insulation film so as to cover the short-circuit detection circuit via a contact hole 63A formed in the insulation film.

Further, the second lead electrode 64 is connected to a pad electrode 59 formed on the insulation film adjacent to the pad electrode 58 via a contact hole 64A formed in the insulation film. Further, the gate electrode 62 is connected to the electrode pad 60 formed on the insulation film adjacent to the pad electrode 59 via a contact hole 62A formed in the insulation film.

In the semiconductor device 800 of FIG. 9, it should be noted that the operation of the transistor is monitored easily by contacting electrode pins with the foregoing electrode pads 56–60.

In the present embodiment, the electrode pad covers a pattern to be connected to another electrode pad. Thereby, it becomes possible to form a large number of monitoring circuits in the limited area of the dicing line 51.

NINTH EMBODIMENT

FIG. 10 shows the construction of a semiconductor device 900 according to a ninth embodiment of the present invention, wherein those parts corresponding to the parts described previously are designated by the same reference numerals and the description thereof will be omitted.

Referring to FIG. 10, the semiconductor device 900 is a modification of the semiconductor device 800 described previously and has a construction in which the short-circuit detection circuit is formed inside the chip region, in other words, in the region surrounded by the moisture-proof guard ring 74.

As represented in FIG. 10, the short-circuit detection circuit is formed right underneath a bonding pad 71 provided in the chip region, wherein it should be noted that the short-circuit detection circuit is connected to an electrode pad 72 formed in the dicing line 51 via the contact hole 54A and further to an electrode pad 73 formed also in the dicing lien 51 via the contact hole 55A.

In the construction of FIG. 10, too, the short-circuit detection circuit does not occupy the chip region of the semiconductor substrate as a result of the formation right underneath the bonding pad 71, and there occurs no decrease of the chip region in which active device elements are to be formed. As the short-circuit detection circuit, or any other monitoring circuit, is disposed inside the chip region in the present embodiment, a reliable monitoring is achieved as compared with the case of forming the monitoring circuits in the dicing lines.

Figure 11:
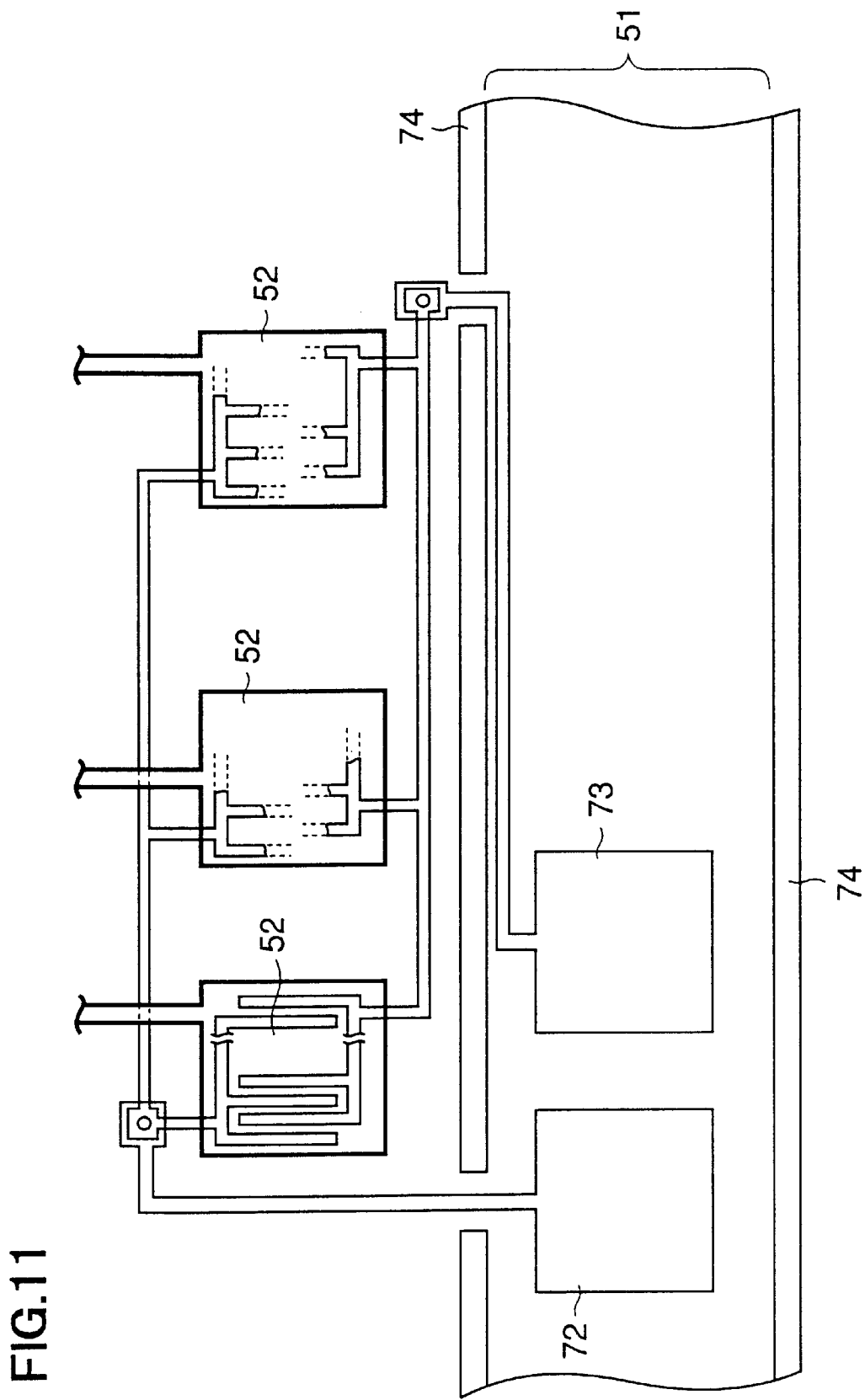
FIG. 11 is a diagram showing a modification of the semiconductor device of FIG. 10.

FIG. 11 shows a modification of the semiconductor device 900 of FIG. 10.

Referring to FIG. 11, a number of short-circuit detection circuits are arranged in the chip region of the semiconductor substrate in a parallel connection, wherein it can be seen that the short-circuit monitoring circuits are connected on the one hand to the electrode pad 72 and on the other hand to the electrode pad 73 both formed on the dicing line.

By providing the short-circuit detection circuits in a plural number, it becomes possible to conduct a short-circuit detection over a wide area of the chip region.

Further, the present invention is not limited to the embodiments described heretofore, but various variations and modifications may be made without departing from the scope of the invention.

The present application is based on Japanese priority application No. 11-74483 filed on Mar. 18, 1999, the entire contents of which are hereby incorporated by reference.

What is claimed is:

1. A semiconductor device, comprising:

a substrate;

an active device formed on said substrate, said active device forming a circuit;

a bonding pad formed on said substrate; and a mark pattern formed between said substrate and said bonding pad in the form of a pattern isolated from the circuit, such that said mark pattern is covered by said bonding pad, said mark pattern being functional for measurement of positional alignment.

2. A semiconductor device as claimed in claim 1, wherein said bonding pad is electrically insulated from said mark pattern.

3. A semiconductor device as claimed in claim 1, wherein said mark pattern includes a pattern separated from said active device.

4. A semiconductor device as claimed in claim 1, wherein said bonding pad has a shape corresponding to an outer shape of said mark pattern.

5. A semiconductor device as claimed in claim 1, wherein said bonding pad and said mark pattern are formed in a device region of said substrate in which said active device is formed.

6. A semiconductor device as claimed in claim 1, wherein said bonding pad and said mark pattern are formed on a dicing line of said substrate.

7. A semiconductor device as claimed in claim 1, wherein said mark pattern includes an alignment mark.

8. A semiconductor device as claimed in claim 1, wherein said mark pattern includes a positioning mark.

9. A semiconductor device, comprising:

a substrate;

an active device formed on said substrate, said active device forming a circuit;

a bonding pad formed on said substrate; and a monitoring pattern formed on said substrate under said bonding pad in the form of a pattern isolated from the circuit, such that said monitoring pattern is covered by said bonding pad, said monitoring pattern being functional for monitoring of a semiconductor fabrication process.

10. A semiconductor device, comprising:

a substrate;

an active device formed on said substrate;

a bonding pad formed on said substrate;

a monitoring pattern formed on said substrate under said bonding pad, such that said monitoring pattern is covered by said bonding pad;

another bonding pad adjacent to said bonding pad in electrical connection with said monitoring pattern; and another monitoring pattern formed right underneath said another bonding pad.

11. A semiconductor device as claimed in claim 1, wherein said mark pattern comprises a control pattern.

12. A semiconductor device as claimed in claim 11, wherein said control pattern comprises an alignment mark pattern.

13. A semiconductor device as claimed in claim 9, wherein said monitoring pattern comprises a monitoring structure.

* * * * *